United States Patent [19]

Turski et al.

[11] 4,053,842
[45] Oct. 11, 1977

[54] MICROWAVE FREQUENCY DISCRIMINATOR COMPRISING AN FET AMPLIFIER

[75] Inventors: Zygmond Turski, Selden, N.Y.; Daniel David Mawhinney, Livingston, N.J.

[73] Assignee: RCA Corporation, New York, N.Y.

[21] Appl. No.: 722,585

[22] Filed: Sept. 13, 1976

[51] Int. Cl.[2] .............................................. H03D 3/26
[52] U.S. Cl. .................................. 329/103; 307/233 R; 328/140; 329/116; 329/119; 329/134; 329/192; 329/205 R; 330/53; 330/277
[58] Field of Search ............... 329/103, 116, 119, 192, 329/205 R, 206, 134; 307/233 R; 328/140; 330/35, 53

[56] References Cited

U.S. PATENT DOCUMENTS 3,163,826  12/1964  Kemper ........................... 329/119 X
3,676,785   7/1972  Pichal .............................. 329/103
3,975,699   8/1976  Van Anda et al. ............. 328/140 X

*Primary Examiner*—Siegfried H. Grimm
*Attorney, Agent, or Firm*—H. Christoffersen; Joseph D. Lazar; Robert M. Rodrick

[57] ABSTRACT

A microwave frequency discriminator comprising a field effect transistor (FET) amplifier, input and output impedance matching networks and a detector. The FET is biased to generate an output RF signal within a predetermined frequency bandwidth in response to an input RF signal of substantially constant power level. The input and output impedance matching networks are arranged to provide the impedance conditions to shape and linearize the power-frequency response of the FET amplifier throughout the predetermined frequency bandwidth such that the frequency response approximates the linear power-frequency characteristic of a frequency discriminator.

8 Claims, 4 Drawing Figures

MICROWAVE FREQUENCY DISCRIMINATOR COMPRISING AN FET AMPLIFIER

The Government has rights in this invention pursuant to Contract No. N00039-74-C-0227 awarded by the Department of the Navy.

CROSS REFERENCE TO RELATED APPLICATIONS

Of interest are the following copending applications: Ser. No. 714,356 (RCA 70,075) filed Aug. 16, 1976, entitled "Microwave Frequency Discriminator," based on the invention of Daniel David Mawhinney and Zygmond Turski; Ser. No. 722,829 (RCA 70,221) filed on even date herewith, entitled "Microwave Frequency Discriminator Comprising a One Port Active Device," based on the invention of Zygmond Turski and Arye Rosen; Ser. No. 722,582(RCA 70,994) filed on even date herewith, entitled, "Improved Microwave Frequency Discriminator Comprising An FET Amplifier," based on the invention of Arye Rosen and Louis Sebastian Napoli, all assigned to the same assignee as is the present invention.

BACKGROUND OF THE INVENTION

1. Field of the Invention

This invention relates to a microwave freqency discriminator and more particularly to a discriminator including a field effect transistor.

2. Description of the Prior Art

Techniques and devices for the rapid and accurate determination of an unknown signal frequency are of significant interest in modern communication systems, in particular, for electronic counter measure (ECM) systems operating at microwave frequencies. Microwave freqency discriminators capable of converting incoming unknown frequencies into voltages for processing are often used in ECM systems. A microwave frequency discriminator has been defined as a circuit that provides an output voltage which is related to and usually proportional to the frequency of the incoming signal. The discriminator voltage output versus frequency response, commonly termed the "discriminator characteristic," is the response in which the output voltage varies nearly linearly with respect to frequency over a predetermined frequency bandwidth. The bandwidth is generally determined by the slope, linearity, and resolution of the discriminator and is the frequency range over which it provides an unambiguous voltage output which is related to input frequency.

A typical prior art broadband microwave discriminator, such as shown by FIG. 1, utilizes passive components such as transmission lines or an arrangement of lumped elements to vary the level of the output power as a function of frequency. Such a discriminator terminated with a square law detector will provide D.C. voltage output proportional to the frequency of the incoming RF signal. A square law detector is defined as a device having a transfer characteristic $V_{out} = k\, V_{in}^2$ where $k$ is proportionality factor, such that the output voltage, $V_{out}$ is proportional to the power of the incoming signal, $V_{in}^2$.

Most discriminators are preceded with a limiter to provide a constant power input to the discriminator, whereby the output voltage from the discriminator is a function of frequency alone. The limiter can be eliminated, however, if the incoming signal has a constant magnitude. Since such a prior art passive discriminator network has no gain, the voltage output which it can produce is restricted by the power available from the limiter preceding the discriminator. The overall linearity and usable bandwidth of the discriminator is also restricted by the frequency response and uniformity characteristics of each of the many elements of such a passive discriminator. In addition, the numerous interconnections in the passive discriminator, as shown in FIG. 1, produce multiple wave reflections which cause distortions of the frequency-voltage discriminator characteristic which reduce the accuracy and usuable frequency range of the discriminator.

As depicted in FIG. 1 of the drawing, a passive-element prior art discriminator 10 comprises a limiter 12 which receives an incoming RF signal 14 of unknown freqeuency and variable power level and converts signal 14 to an RF signal 16 of constant power level. Signal 16 is applied to a 3 db hybrid coupler 18 which splits signal 16 into two signal components. One component of the split signal is transmitted through a short path 20 and the other component through a longer path 22. The different path lengths produce different phase shifts of the two signal components. The split signals are recombined in another 3 db hybrid coupler 24. The power levels of the two outputs of the 3 db hybrid coupler 24 vary with frequency as a result of the vector summation of the two split signals having a differential phase shift. Detector diodes 26 and 28 are utilized to demodulate the frequency dependent signal received from coupler 24 and convert the signal into a D.C. voltage. A video amplifier 30 may be used to sum or compare and amplify the D.C. signal for subsequent measurement or display.

SUMMARY OF THE INVENTION

According to the present invention, a microwave frequency discriminator comprises a transistor amplifier including a field effect transistor having an input port for receiving and input RF signal of substantially constant power level and an output port. The transistor is biased an amount for generating an output RF signal within a predetermined frequency bandwidth in response to the input RF signal. An input impedance matching network is connected to the input port and an output impedance matching network is connected to the output port. The input and output impedance matching networks are formed to provide selected input and output impedance conditions to the amplifier such that the power of said output RF signal varies substantially linearly with the frequency of said input RF signal throughout the frequency bandwidth. A detector responsive to the output RF signal generates a D.C. signal varying substantially linearly as a function of the frequency of the input RF signal.

In an environment of a wide band input RF signal of varying power level, limiter means may be used to provide an RF signal of substantially constant power level to the amplifier.

DETAILED DESCRIPTION OF THE PREFERRED EMBODIMENTS

Figure 1:
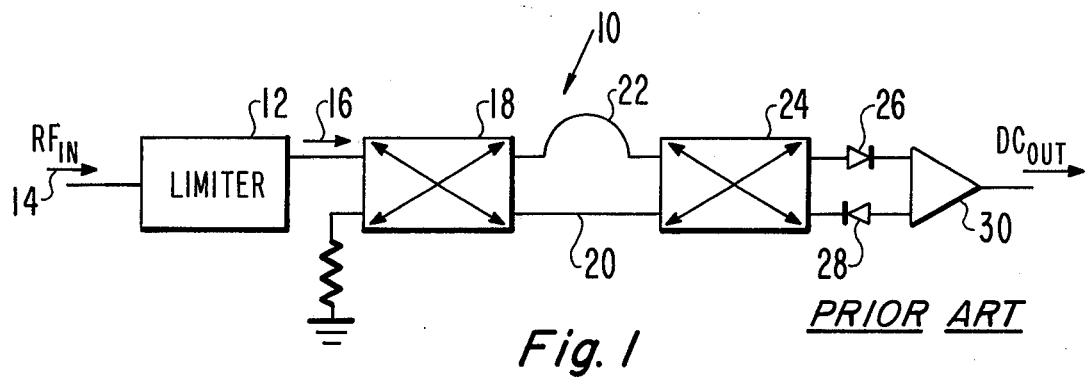
FIG. 1 is a schematic representation of a prior art frequency discriminator, described in detail in the "Description of the Prior Art" section above.
Figure 2:
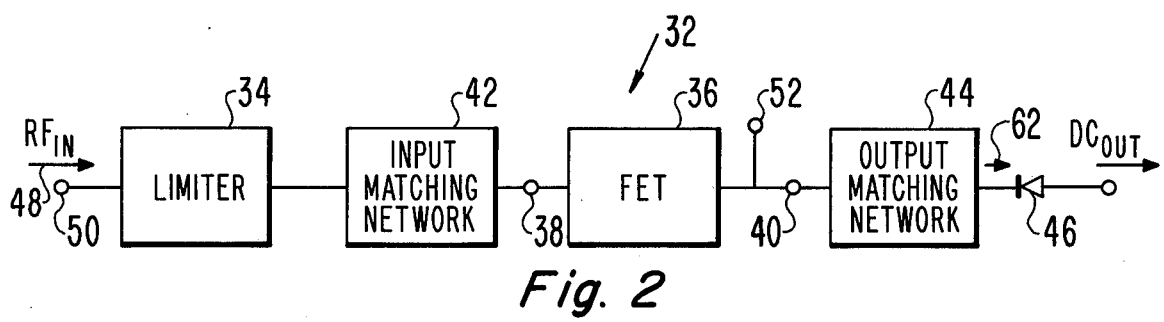
FIG. 2 is a schematic diagram of a frequency discriminator of the present invention.

Referring to the drawing, there is shown in FIG. 2 a schematic diagram of a microwave discriminator 32 according to one embodiment of the present invention. Discriminator 32 includes a limiter 34, a field effect transistor (FET) 36, having an input port 38 and an output port 40, input impedance matching network 42, output impedance matching network 44 and a detector diode 46.

An input RF signal 48 of unknown frequency, which may be of variable power level, is applied to the input 50 and processed by limiter 34. The function of limiter 34 is to provide an output RF signal having a predetermined power level which is invariant with the power level and frequency of the incoming signal, so that it may be processed by FET 36, matching networks 42 and 44 and detector 46 as described hereinafter. It should be understood that limiter 34 may be unnecessary and eliminated if the incoming RF signal 48 has a relatively constant power level.

Figure 3:
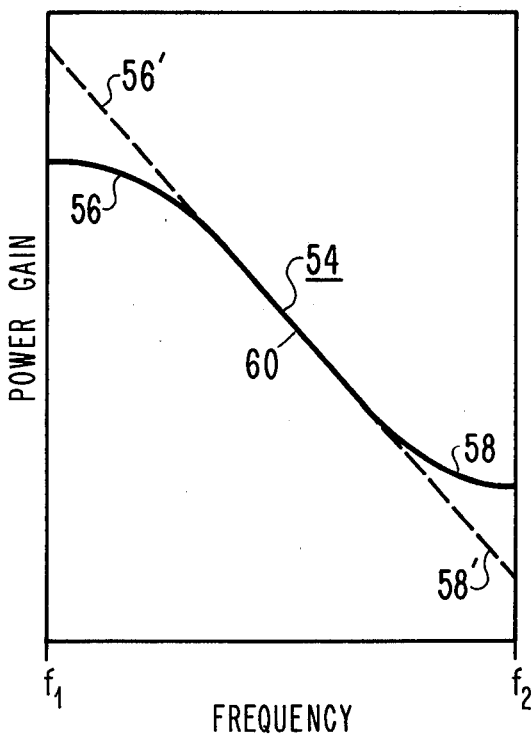
FIG. 3 shows the power gain versus frequency of an FET amplifier with and without linearization.

In a preferred embodiment of the invention, FET 36 is a gallium-arsenide (GaAs) Schottky barrier field effect transistor selected for its desirable high gain properties in a selected frequency range although any FET device may be used to practice the invention. FET 36 is arranged to operate as a transistor amplifier by application of a suitable bias voltage to generate an output RF signal as by bias terminal 52, terminal 52 being connected to a voltage source (not shown). A power gain of a typical FET amplifier is shown in FIG. 3 as by the solid-line curve 54 comprising portions 56, 58 and 60. In a given frequency bandwidth, for example, from $f_1$ to $f_2$, the gain of such an FET amplifier varies non-linearly with respect to frequency at the respective end portions 56 and 58 of the frequency bandwidth. In the center portion 60 of the response the gain varies substantially linearly with respect to frequency.

According to the present invention, the end portions 56 and 58 of the FET characteristic are linearized to approximate a linear power-frequency discriminator characteristic throughout the entire frequency range from $f_1$ to $f_2$ by input and output impedance matching networks 42 and 44, respectively. Input impedance matching network 42 is connected to input port 38 of FET 36 and to limiter 34 to receive the limited incoming RF signal. Output impedance matching network 44 is connected to output port 40 of FET 36 and to detector diode 46. The input and output impedance conditions to FET 36 are adjusted, as explained below, in the input and output networks 42 and 44 to enhance the slope and to linearize portions 56 and 58 to linear portions 56' and 58', respectively as shown in FIG. 3. Thus, the FET amplifier power-frequency response is made substantially linear throughout the frequency bandwidth from $f_1$ to $f_2$.

Figure 4:
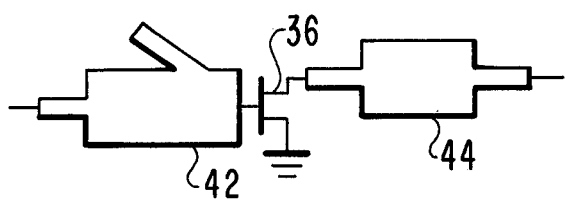
FIG. 4 is an illustration of a portion of a preferred embodiment of the invention in a microstrip circuit transmission line configuration.

In a preferred embodiment of the invention, FET 36, input network 42 and output network 44 are arranged in a microstrip circuit transmission line configuration although other circuits such as, for example, coaxial-line circuits, waveguide circuits and stripline circuits may also be used. In the microstrip circuit form the input and output networks 42 and 44 are conductive transmission line elements, the geometric shapes of which are varied to adjust the impedance conditions to achieve the desired linear discriminator characteristic. The topology of input network 42 and output network 44 for a selected frequency discriminator characteristic in a microstrip circuit form is shown, for example, in FIG. 4. The particular topology of these networks is determined by the impedance conditions required to enhance the slope and to linearize the end portions of the FET 36 amplifier power-frequency response. Variations in the network shapes change the impedance conditions to the FET 36 amplifier. The topology which provides the impedance conditions for a substantially linear power/frequency response is selected for a specific discriminator application. Selection of a desired topology and the design of input and output impedance matching networks may be facilitated by use of computer-aided analysis-optimization routines.

The RF signal 62 from output network 44 having a linear power-frequency relation is received by detector diode 46 which is connected to output network 44. The RF signal 62 is demodulated by detector diode 46 and converted into a D.C. signal for subsequent processing (not shown). It is preferable that detector diode 46 be of the square law type. A square law detector has a characteristic $V_{out} = k\, V_{in}^2$, where $k$ is the detector sensitivity factor such that the output D.C. voltage will vary substantially linearly as a function of the input RF signal.

The microwave discriminator of the present invention as described herein achieves the desired frequency discriminator characteristic without the passive components of the prior art which, because of the double path structure and numerous interfaces, require critical dynamic impedance matching. Introduction of the active FET element in discriminator circuitry as described in the present invention, provides significantly higher sensitivity than the prior art devices, consequently broadening the operational bandwidth and substantially improving the resolution. In addition, the FET is an active element which produces a power gain eliminating the requirement of subsequent signal amplification. For example, a discriminator using conventional passive-element interferometer techniques in the frequency bandwidth of 8 to 12 GHZ provides a resolution of about 150 micro-volts/MHZ whereas the present invention provides a resolution of approximately 310 micro-volts/MHZ which is better than twice that of the prior art. Furthermore, elimination of the passive components results in a decrease in size and a reduction in cost. Such an FET discriminator as described herein, including the FET device with bias circuits, matching networks and detector diode may be fabricated on a single microwave integrated circuit (MIC) structure for improved performance and further size and cost reductions.

Although the invention can be used to scan for and detect signals of an unknown frequency in electronic counter measure (ECM) systems, the invention can also be used in scanning for frequency modulated signals modulated with information signals. The detector output will generate a D.C. signal representing the modulating signal.

What is claimed is:

1. A microwave frequency discriminator comprising:
    a transistor amplifier including a field effect transistor having an output port and an input port for receiving an input RF signal of substantially constant power level, said transistor being biased an amount for generating an output RF signal within a predetermined frequency bandwidth in response to said input RF signal;

input and output matching means connected to said input and output ports, respectively, said input and output matching means being formed to provide selected input and output impedance conditions to said amplifier such that the power of said output RF signal varies substantially linearly with the frequency of said input RF signal throughout said frequency bandwidth; and detector means responsive to said output RF signal for generating a D.C. signal varying substantially linearly as a function of the frequency of said input RF signal.

2. A microwave frequency discriminator according to claim 1, wherein said transistor amplifier comprises a microstrip circuit transmission line and wherein said input and output impedance matching means are microstrip circuit networks having a topology configured respectively to provide the selected input and output impedance conditions for linearizing the frequency response of said transistor amplifier.

3. A microwave frequency discriminator according to claim 1, wherein said detector means comprises a square law detector.

4. A microwave frequency discriminator according to claim 1, wherein said field effect transistor is a gallium-arsenide (GaAs) Schottky barrier field effect transistor.

5. A microwave frequency discriminator comprising:

signal limiting means responsive to an input RF signal of varying power level for generating an RF signal of substantially constant power level;

a transistor amplifier including a field effect transistor having an output port and an input port for receiving said RF signal of substantially constant power level, said transistor being biased an amount for generating an output RF signal within a predetermined frequency bandwidth in response to said RF signal of substantially constant power level;

input and output matching means connected to said input and output ports, respectively, said input and output matching means being formed to provide selected input and output impedance conditions to said amplifier such that the power of said RF signal varies substantially linearly with the frequency of said input RF signal throughout said frequency bandwidth; and detector means responsive to said output RF signal for generating a D.C. signal varying substantially linearly as a function of the frequency of said input RF signal.

6. A microwave frequency discriminator according to claim 5, wherein said transistor amplifier comprises a microstrip circuit transmission line and wherein said input and output impedance matching means are microstrip circuit networks having a topology configured respectively to provide the selected input and output impedance conditions for linearizing the frequency response of said transistor amplifier.

7. A microwave frequency discriminator according to claim 5, wherein said detector means comprises a square law detector.

8. A microwave frequency discriminator according to claim 5, wherein said field effect transistor is a gallium-arsenide (GaAs) Schottky barrier field effect transistor.

* * * * *